United States Patent [19]

Burkhart et al.

[11] 4,418,473
[45] Dec. 6, 1983

[54] METHOD OF MAKING EDGE PROTECTED FERRITE CORE

[75] Inventors: Robert W. Burkhart, Tucson, Ariz.; Allen R. Cox, Chandlers Ford; John D. Hartley, Winchester, both of England

[73] Assignee: International Business Machines Corp., Armonk, N.Y.

[21] Appl. No.: 362,425

[22] Filed: Mar. 26, 1982

[51] Int. Cl.$^3$ .............................................. G11B 5/42
[52] U.S. Cl. ............................. 29/603; 204/192 D; 360/122; 427/127; 427/209; 427/255
[58] Field of Search ......................... 29/603; 360/122; 204/192 D, 192 N, 192 R; 427/127, 255, 209

[56] References Cited

U.S. PATENT DOCUMENTS

| | | | |
|---|---|---|---|
| 3,562,442 | 2/1971 | Pear, Jr. ............................. | 29/603 X |
| 3,614,831 | 10/1971 | Grundtner et al. ................. | 29/603 |
| 3,886,025 | 5/1975 | Riseman ............................. | 29/603 X |
| 3,911,579 | 10/1975 | Lane et al. ......................... | 204/192 D X |
| 4,252,837 | 2/1981 | Anton ................................ | 204/192 N X |
| 4,298,899 | 11/1981 | Argumedo et al. ................. | 29/603 X |

Primary Examiner—Carl E. Hall
Attorney, Agent, or Firm—J. A. Pershon; H. F. Somermeyer

[57] ABSTRACT

The sputter deposition of a thin film of material on both sides of a thin substrate is performed by positioning the substrate sides orthogonal to the target and preferably radial to the deposition center of the sputter system. The vapor deposition of alumina on a thin ferrite core for a magnetic head is accomplished by positioning the ferrite substrate in the vacuum chamber orthogonally to the target and radial to the particle deposition center. The alumina is deposited on both sides of the ferrite core simultaneously to substantially the same thickness. The deposition on both sides of the ferrite core protects the core against width erosion, and minimizes bending stress. In addition, signal output of the ferrite core when used in a magnetic head is increased.

16 Claims, 5 Drawing Figures

METHOD OF MAKING EDGE PROTECTED FERRITE CORE

FIELD OF THE INVENTION

This invention relates in general to a method for depositing on both sides of a ferrite core and in particular to a process of making an edge protected ferrite core for a magnetic head assembly.

BACKGROUND OF THE INVENTION

Magnetic head assemblies which incorporate ferrite cores are widely used in audio, video and data processing systems. Ferrite is known to be brittle and, therefore, during machining and shaping as well as during operation in the sensing of magnetic media, the ferrite edges and corners can be chipped and otherwise eroded. As the ferrite cores are made smaller and narrower to increase data track density, the chipping and erosion problem exponentially increases. Life and output decrease, thereby adding significantly to the cost of maintenance since the heads have to be replaced and to costs of production because the chipped ferrite cores must be rejected.

Ferrite cores have been assembled with ceramic supports or glass layers to add to the structural strength. It has been found as noted in U.S. Pat. No. 4,298,899, which is assigned to the assignee of the present invention, that layers of alumina films deposited on the sides of the ferrite core before insertion into a magnetic head assembly provide a support to the edges of the ferrite core during the lapping process to determine the throat height for the head as well as providing an edge support during the reading and writing of magnetic transitions from magnetic media. However, the deposition of the alumina was performed on one side at a time which led to stressing of the ferrite cores due to the thermal mismatch of the ferrite material and the alumina. This stress is compounded when the alumina is then deposited on the opposite side. This stress decreased the magnetic properties of the ferrite core. Thus the deposition material on the sides of the ferrite core to prevent edge erosion led to a problem of thermal mismatch between the ferrite core and the deposited material during the deposition process, resulting in stress.

An object of the present invention, therefore, is to provide a magnetic ferrite core assembly which has a longer wear life and is less subject to core erosion and deterioration by a new process for depositing the material onto the sides of the ferrite core.

DESCRIPTION OF THE PRIOR ART

The prior art is exemplified by the vacuum deposition systems wherein the sputtering is performed onto items when the part is placed parallel to the target material and is cooled by the substrate backing plate. However, for many very thin substrates such as a ferrite core for a magnetic head, when you deposit material on one side of the very thin substrate, the part is stressed out of flat due to the thermal mismatch of the material of the substrate and the deposited material. This stress is compounded when the deposited material is deposited on the opposite side.

As stated in the aforementioned U.S. Pat. No. 4,298,899, it is often necessary to deposit a hard material on the edges of ferrite cores for later placement into a magnetic head assembly. The ferrite cores are generally very thin, on the order of four thousandths of an inch, in order to be able to read and write data onto a very narrow track width on a magnetic media. According to the aforementioned patent, alumina is deposited onto each side of the ferrite core to prevent chipping during the manufacturing process and edge erosion during the operation of the magnetic head in the sensing of data from a magnetic media.

It is, therefore, an object of the present invention to provide an improved method of depositing a material on both sides of a very thin substrate.

Another object of the present invention is to provide an improved method of making ferrite cores for magnetic head assemblies.

Yet another object of the present invention is to provide a method of making ferrite cores for magnetic head assemblies wherein a hard material is deposited on both sides of the ferrite core at the same time in a vacuum deposition system.

SUMMARY OF THE INVENTION

In accordance with the present invention, a method for depositing a material on both sides of a very thin substrate includes the steps of loading the substrates onto a fixture wherein the sides of the substrate are perpendicular to the target in the vacuum deposition system. The fixture is then placed in a vacuum deposition system in order to maintain the position such that each substrate loaded onto the fixture has its two sides perpendicular to the target. The vacuum deposition is then activated to deposit the material onto all exposed surfaces of the substrate at one time. The fixture is placed onto a substrate cooling system to keep the substrate cool during the vacuum deposition. The fixture is then removed from the system after the deposition of the material.

For the preferred embodiment, a method of making an edge-protected ferrite core for a magnetic head assembly comprises the steps of forming the flat ferrite core pieces and ceramic supporting pieces. The formed ferrite and ceramic pieces are then edge bonded together to form a complete ferrite core for a magnetic head. These ferrite cores are then loaded onto a fixture for use in a vacuum deposition system, preferably a sputter system. The next step is to place the loaded fixture with the ferrite cores in the vacuum deposition system such that the magnetic sensing edge of each of the ferrite cores placed into the fixture faces the target and has its sides of plate-like surfaces perpendicular to the target and the support system holding the fixture. The vacuum deposition system is then activated to deposit a material onto the exposed edges and sides of the ferrite core and then the fixture is removed from the vacuum deposition system. The ferrite core is then lapped at its operational edge to remove the deposited material from the operational edge and to provide the desired throat height of the ferrite core as desired.

It is, therefore, an object of the present invention to provide an improved deposition method to deposit a material on both sides of a thin substrate in one operation.

Another object of the present invention is to provide a method of depositing a hard material onto both sides of a ferrite core at one time in a sputter deposition system.

A further object of the present invention is to provide a method of making edge-protected ferrite cores by the deposition of alumina to both sides of the ferrite cores in a sputter deposition system with the ferrite cores supported in a fixture wherein the magnetic sensing edge of the ferrite core is directed perpendicular to the target and the supporting substrate.

These and other objects of the present invention will become apparent to those skilled in the art as the description proceeds.

BRIEF DESCRIPTION OF THE DRAWINGS

The various novel features of this invention, along with the foregoing and other objects, as well as the invention itself, both as to its organization and method of operation, may be fully understood from the following description of illustrated embodiments when read in conjunction with the accompanying drawing, wherein.

DESCRIPTION OF THE PREFERRED EMBODIMENTS

The embodiments of the present invention are directed towards the methods of depositing onto both sides of a thin substrate in one vacuum deposition operation. The preferred embodiment is directed toward a method of producing ferrite cores using the steps of the invention. In the preferred embodiment of making a ferrite core for a magnetic head assembly, the ferrite core is first produced by standard methods and then a film of alumina is deposited on both sides of the ferrite core in one sputter deposition operation. The preferred ferrite cores are essentially thin substrates which are placed in a specific pattern in a sputter deposition system for accomplishment of the present invention.

The sputter deposition of a thin film of material on both sides of a thin substrate is performed by positioning the substrate side orthogonal to the target and preferably radial to the target or cathode of the sputter system. The vapor deposition of alumina on a thin ferrite core for a magnetic head is accomplished by positioning the ferrite substrate in the vacuum chamber orthogonally to the target surface. The preferential position is radial to the particle deposition center. The alumina is deposited on both sides of the ferrite core simultaneously to substantially the same thickness. The deposition on both sides of the ferrite core protects the core against width erosion, and minimizes bending stress. In addition, signal output of the ferrite core when used in a magnetic head is increased.

Figure 1:
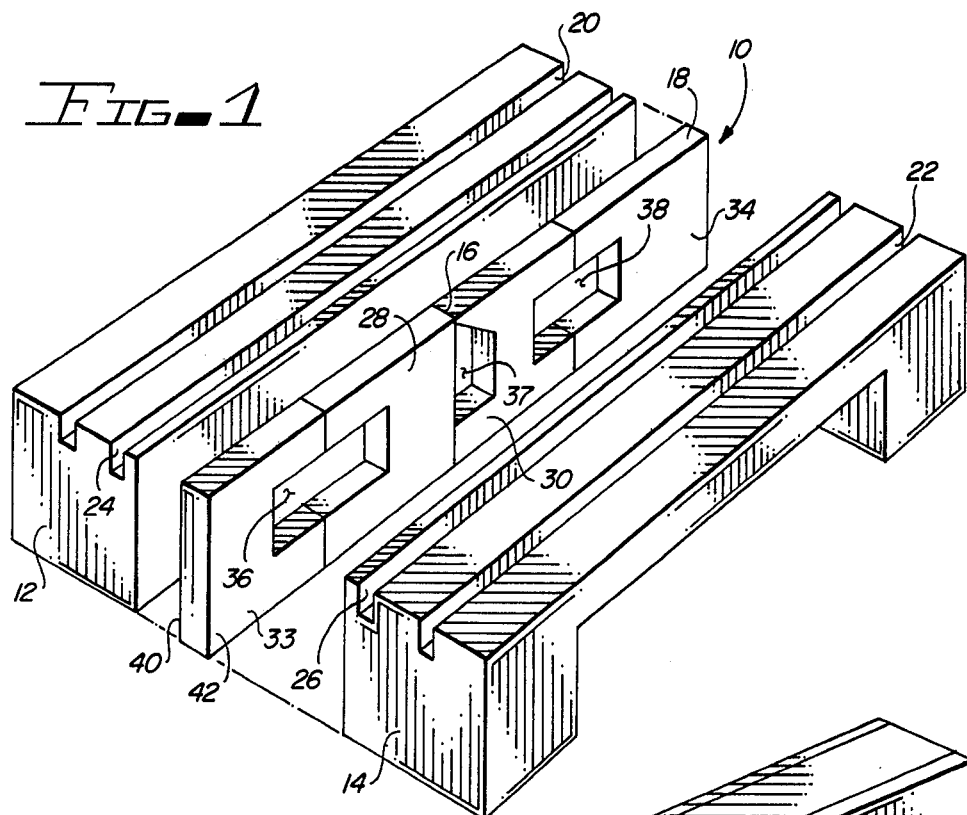
FIG. 1 is a perspective view of a magnetic head assembly showing a ferrite core processed according to the present invention.

Referring to FIG. 1, a magnetic head slider assembly includes a ferrite core 10 which is sandwiched between two configured ceramic slabs 12 and 14. The ferrite core 10 has a transducing gap 16 located on one edge of the ferrite core 10 which is formed to be an air bearing surface 18. The ceramic slabs 12 and 14, which may be formed from barium titanate ceramic, by way of example, each have respective slotted portions 20, 22, 24 and 26 formed in the same surface as air bearing surface 18. These slots form rails that provide a configuration for affording relatively close flying height of the head slider assembly and the transducing gap 16 relative to a moving magnetic medium.

The ferrite core 10 includes two ferrite blocks 28 and 30 which form the transducing gap 16. Ceramic blocks 33 and 34 are bonded to the free edges of the ferrite pieces 28 and 30, respectively, to form the ferrite core 10. The ferrite core 10 includes apertures 36, 37 and 38. An electrical coil is wound about the ferrite piece 28 or 30 through the apertures 36 and 37, or through the apertures 37 and 38 after the sandwich-type head assembly formed by ceramic blocks 12 and 14 encompassing the ferrite core 10 are bonded together. The winding of the electrical core and the formation of the head assembly is performed in a well known manner and need not be further described herein.

The ferrite core 10 includes films 40 and 42, preferably of alumina, vacuum deposited on each side. These films 40 and 42 must be of a very hard material which is why alumina is preferred. The films 40 and 42 provide the necessary support to the brittle ferrite pieces 28 and 30 of the ferrite core 10. The films 40 and 42 prevent chipping and erosion of the various pieces in the ferrite core 10 that may occur during the processing steps of the ferrite core or during the operation of the head slider assembly with relation to the moving magnetic media, which may be a magnetic tape, for example. The films 40 and 42 may be sputter deposited in a vacuum deposition system such as shown in FIG. 2.

Figure 2:
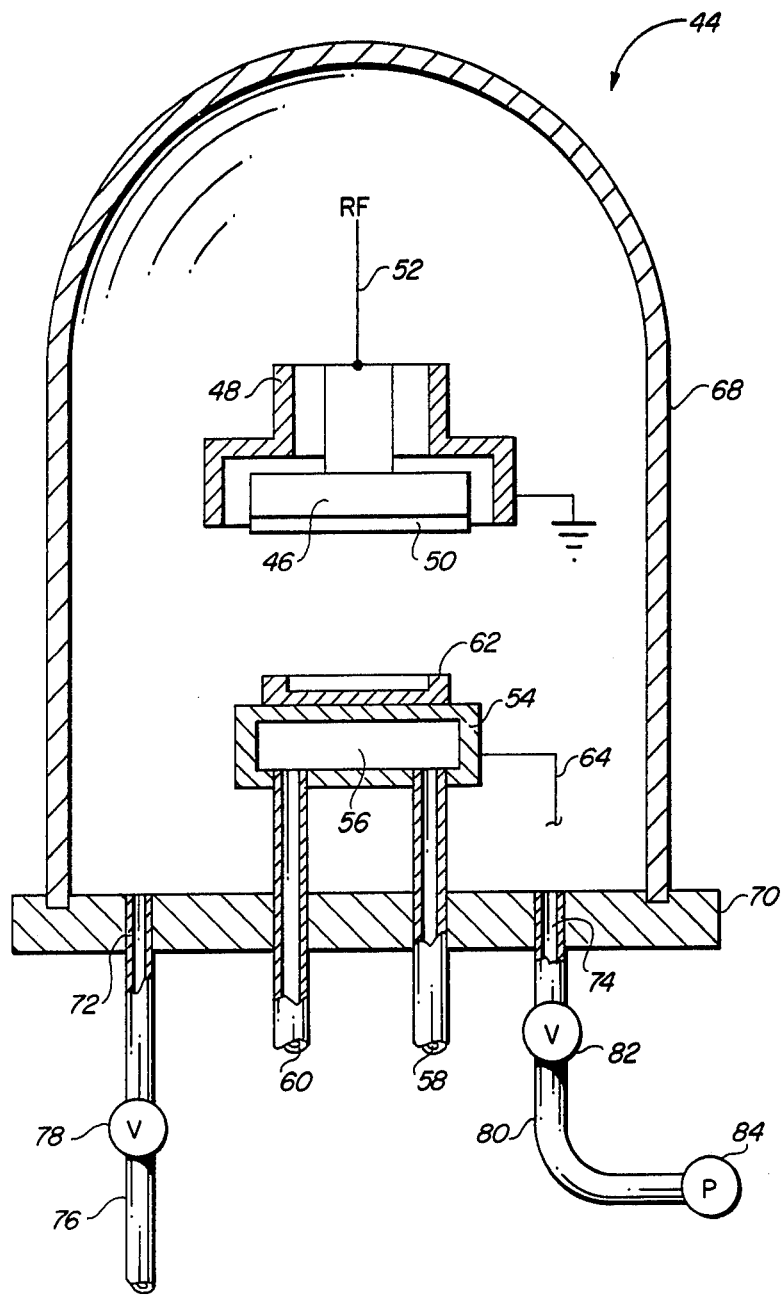
FIG. 2 is a schematic representation of the diode sputtering apparatus utilized in the performance of the present invention.

FIG. 2 schematically illustrates the general type of sputter deposition apparatus, depicted as numeral 44, utilized in the practice of the present invention. Sputtering apparatus 44 includes a first electrode 46, the cathode assembly formed to also function as a heat sink, surrounded by a shield 48. Bonded to the surface of the cathode assembly 46 is a layer of the alumina material forming the target 50. Coupled to the cathode assembly 46 is an RF lead 52 of a power supply (not shown).

Below the target 50 is placed, in substantially parallel spaced relation thereto, an anode assembly 54 which includes a housing through which a cooling fluid 56, such as water, flows by way of inlet 58 and outlet 60. On the surface of the anode assembly 54 is a fixture 62. A lead 64 is connected to the anode assembly 54. The anode assembly may be placed at an electrical ground via lead 64, or maintained at a bias voltage via an RF lead at substantially lower voltage than the cathode.

Enclosing the electrodes is a bell jar 68 which in turn rests on a base member 70. Base 70 includes two ports 72 and 74. The first port 72 is an inlet for a suitable gas directed into the bell jar 68 via a conduit 76 under control of a gas control valve 78. Argon, for example, furnishes the necessary ionized particles for bombarding the surface of the target 50. The second port 74 connects to a second conduit 80 which in turn is controlled by a valve 82 and is coupled to a vacuum pump 84. The vacuum pump 84 serves to maintain the environment within the bell jar at a vacuum pressure for the sputter deposition operation. The preferred embodiment of a fixture 62 for holding the very thin substrate during the procedure according to the present invention is shown in FIG. 3.

Figure 3:
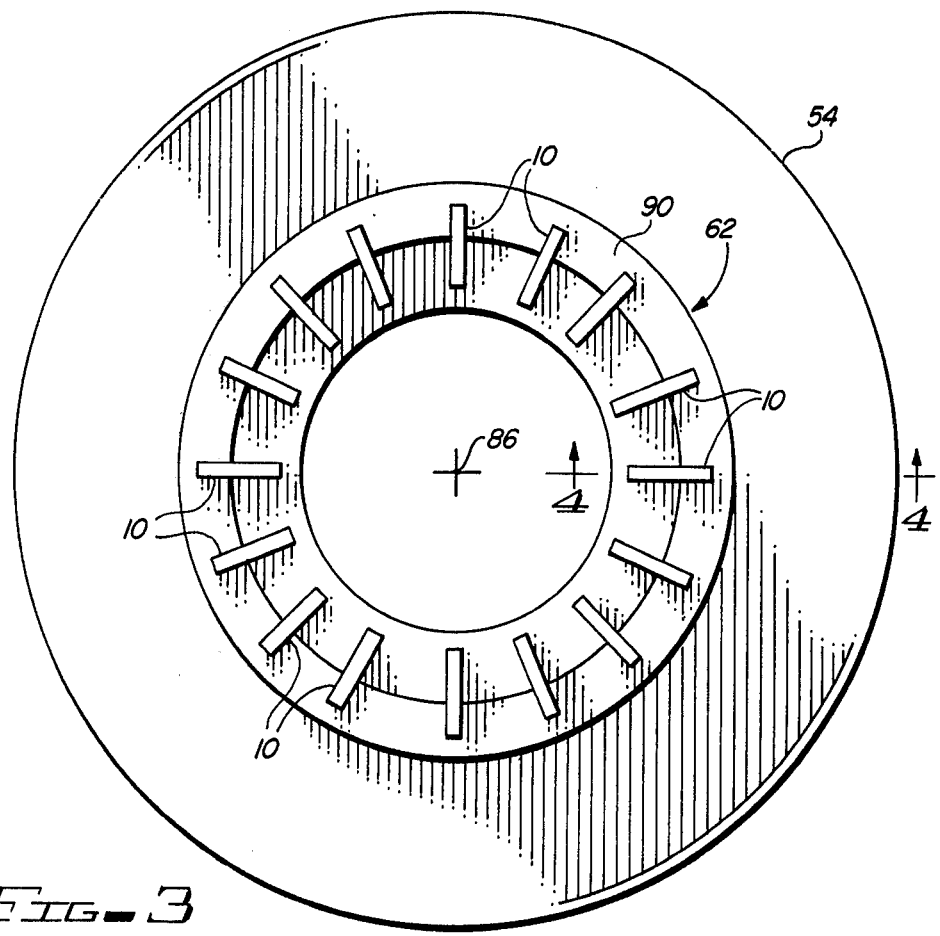
FIG. 3 is a top plan view of the anode substrate supporting assembly containing a preferred fixture for performing the deposition process according to the present invention as part of the sputtering assembly of FIG. 2.

Referring to FIG. 3, the anode assembly 54 is shown having the fixture 62 mounted thereon. The fixture 62 is formed as a circular ring having a plurality of very thin substrates shown as the ferrite cores 10 mounted around the top surface of the fixture 62. As shown in FIG. 3, the ferrite cores 10 are mounted such that one of their edges is directed perpendicular to the particle deposition center identified by reference numeral 86 with the surface of both sides of the ferrite cores 10 radially positioned with respect to the particle deposition center 86. A plurality of ferrite cores are shown mounted onto the fixture 62 but it should be obvious that perhaps only one very thin substrate could be mounted within the sputter deposition chamber. The use of a plurality of very thin substrates mounted onto the fixture 62 provides an economical operation since a plurality of very thin substrates have the film of alumina deposited on their exposed surfaces in one pump down of the sputter apparatus. The position of the ferrite cores 10 in a circle, with the sides of the ferrite cores positioned essentially on a radius of the circle with the center of the circle being the particle deposition center 86, provides the preferred deposition processing position wherein essentially equal amounts of the target material are deposited on each side of the ferrite cores 10. A close-up of one ferrite core mounted for deposition in the fixture 62 is shown in FIG. 4.

Figure 5:
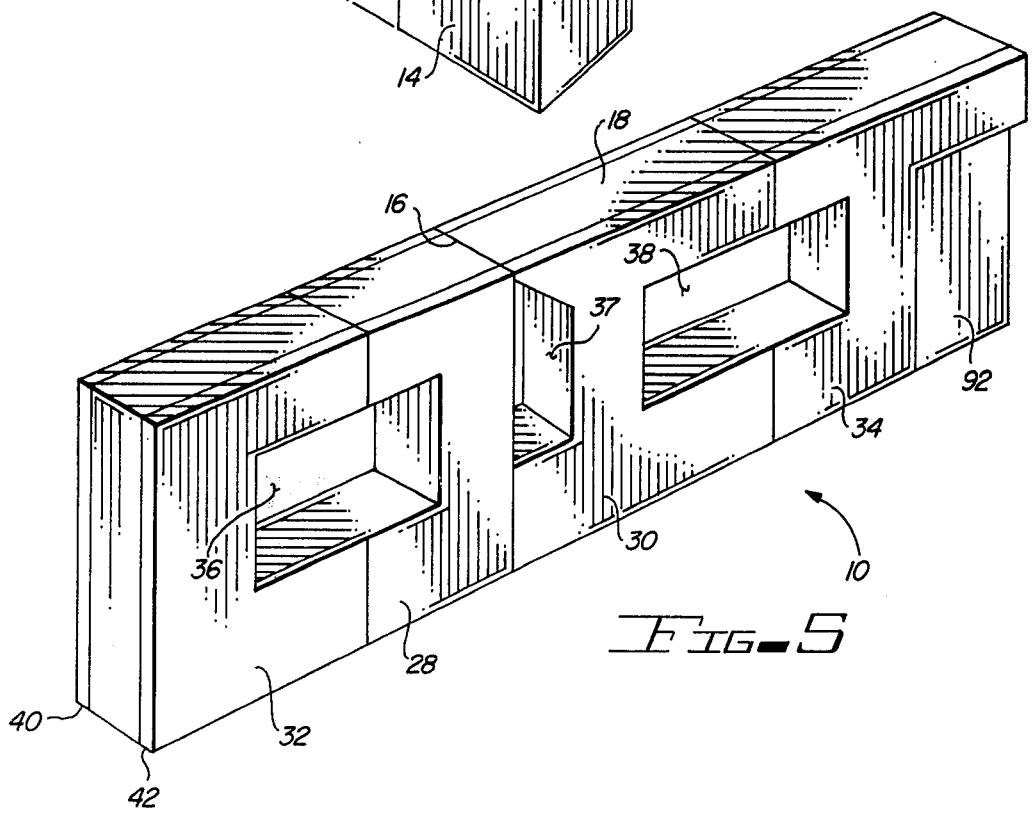
FIG. 5 shows a perspective view of a ferrite core processed according to the present invention for inclusion in the magnetic head assembly of FIG. 1.
Figure 4:
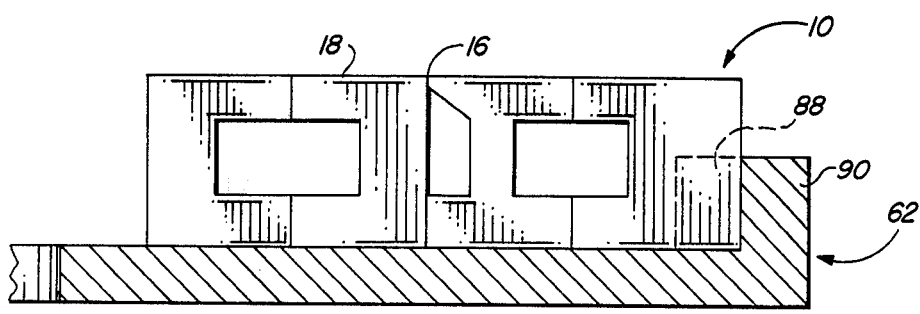
FIG. 4 is a cross-sectional view taken along lines 4—4 of FIG. 3 showing a preferred fixture for holding ferrite cores for processing according to the preferred embodiment of the present invention.

In FIG. 4, one ferrite core 10 is shown mounted in a slot 88 formed in an upright portion 90. Upright portion 90 is formed around the periphery of the fixture 62 and is provided with a plurality of such slots 88 in order to hold the separate ferrite cores 10 in an upright position as shown in FIG. 3. This upright position allows the sputtering assembly 44 of FIG. 2 to deposit the material, preferably alumina, from the target 50 onto all exposed edges and sides of the ferrite core 10. The portion of the ferrite core 10 that is placed into the slot 88 is not covered by the alumina material as is shown in FIG. 5. All other edges are covered by the alumina material, incuding the air bearing surface 18. The alumina is not desired on the air bearing surface 18 since this would position the transducing gap 16 a further distance away from the magnetic media and would result in a lowering of the output from the magnetic head. Thus the ferrite core 10 is lapped to remove the alumina coating before the ferrite core is included as part of the magnetic head assembly as shown in FIG. 1. A finished ferrite core 10 for inclusion into a magnetic head assembly is shown in FIG. 5.

Referring to FIG. 5, the ferrite core 10 is shown in an enlarged perspective view to show the thin films 40 and 42 of alumina deposited onto both sides of the ferrite core 10, except for area 92. Area 92 is the section of the ceramic body 34 that is placed within the slot 88 in the upright portion 90 of the fixture 62 (see FIG. 4). The area 92 can be removed from the ferrite core 10 or can be compensated for by the bonding material such as glass when the ferrite core 10 is placed in the sandwich structure such as shown in FIG. 1. The uncoated area 92 does not effect the operation of the ferrite core 10 since the entire length of the edge of the air bearing surface 18 includes the edge protection provided by the thin film alumina layers 40 and 42. Thus the ferrite core shown in FIG. 5 could be included into the magnetic head structure of FIG. 1 for the further processing to produce the eventual total magnetic head package according to the procedures well known in the prior art. In operation according to the present invention, the method of depositing a film of material onto very thin substrates is produced according to the following procedure. At least one substrate is mounted on a fixture such that the substrate is held on edge and positioned with its sides perpendicular to the target of the fixture. The fixture is then placed in a vacuum deposition system such as a sputter system that the vertically positioned sides are radially directed toward the center of deposition, between the target and the anode assembly of the sputter system, for instance. In the next step, the target material is deposited on all exposed edges and sides of the substrate. The substrates are then removed with the fixture from the sputtering system.

For the preferred embodiment of the process for the formation of an edge-protected ferrite core for a magnetic head, the ferrite core is first produced by edge joining the magnetic ferrite pieces to form a transducing gap 16. Next, the ceramic pieces supporting the ferrite pieces are edge attached to form a ferrite core by bonding the non-magnetic ceramic pieces to the joined ferrite magnetic pieces. The joined ferrite core is then loaded into a fixture such that the air bearing surface of the ferrite core is exposed with the sides of the ferrite core mounted in a vertical direction relative to the base of the fixture. The fixture is then loaded onto the anode assembly of the sputter system such that the end of the ferrite core is perpendicular to and its sides are radially directed toward the deposition center of the sputter system. The sputter system is then activated to deposit a target material, preferably alumina, onto all of the exposed surfaces of the ferrite core. The fixture with the thin film deposited ferrite core is then removed after the sputter system procedure and the air bearing surface is then lapped to remove the thin film of alumina material. For the purposes of the preferred embodiment, the very thin ferrite core has a thickness of approximately four thousandths of an inch with the film of alumina deposited onto the sides of the ferrite core being in the range from 50 to 200 micro-inches by way of example. The sputtering system operates at a target or cathode power of 500 to 900 watts with a $-50$ to $-100$ bias voltage applied to the anode or substrate holder. The deposition is carried on for approximately 36 hours to obtain a deposition of 200 micro-inches of alumina films on the sides of the ferrite core. The argon pressure is approximately 0.01 TORR. The anode to cathode spacing is approximately one inch. The argon flow is set at 100 cubic centimeters per minute. The system was originally pumped down to $2 \times 10^{-6}$ TORR. A sputter edge procedure may preclude the sputter deposition of the alumina. For the preferred embodiment, the ferrite cores were sputter etched for 25 minutes on each side in the same sputter system pump down situation.

The advantages of depositing according to the preferred embodiment of the present invention are that both sides are deposited having the same thickness. It has been found that the only firm criteria is that the thin substrate be mounted perpendicular to the target.

The principles of the present invention have now been made clear in an illustrative embodiment. There will be immediately obvious to those skilled in the art many modifications of the structure, arrangements, proportions, the elements, materials and components used in the practice of the invention. For instance, many different shapes of very thin substrates can be used in the practice of the method according to the present invention. The structure of the ferrite core as shown in the preferred embodiment of the method for making a ferrite core is but one example of the types of ferrite cores that could be manufactured according to the process of the present invention. It should be evident that although alumina is the preferred material for depositing onto the sides of the ferrite core for the protection of the edges, other materials could be used without departing from the present invention. The sputtering apparatus disclosed herein is but one example of vacuum deposition apparatus that may be practiced with the present invention. It should be evident that although a circular fixture is disclosed in the preferred embodiment, that other types of fixtures are anticipated with the only criteria that the fixtures support the substrates in a vertical position, that is, a position perpendicular to the target and cathode assembly and preferably with the sides along a radial position relative to the particle deposition center. In other words, each of the sides of one substrate should have opposing points the same distance away from the deposition center. The vertical orientation establishes this perpendicularity because the common orientation of the sputter deposition systems is with the target and anode assembly in the horizontal position.

Various vacuum deposition systems and methods of operation usable in the present invention are described in a book entitled "Handbook of Thin Film Technology", edited by L. J. Maissel and R. Glang, copyrighted in 1970, McGraw-Hill Book Company. The appended claims are, therefore, intended to cover and embrace any such modifications within the limits only of the true spirit and scope of the invention.

What is claimed is:

1. A process for making a ferrite core for a magnetic head comprising the steps of:
   obtaining two very thin plate-like substrates respectively of a magnetic ferrite material and a non-magnetic ceramic material, each having a narrow edge circumscribing the substrate as a plurality of continuous edge surfaces and joining two outwardly facing plate-like surfaces;
   edge bonding the obtained substrates to form a bonded ferrite core having a transducing gap intermediate the bonded substrates at an air bearing one of said edge surfaces of the just-formed bonded ferrite core;
   placing at least one bonded ferrite core into a vacuum deposition system such that the plate-like surfaces of the bonded ferrite core are disposed perpendicularly to a target of a film material to be deposited on the bonded ferrite core and keeping the plate-like surfaces spaced from any other item in the vacuum deposition system;
   operating the deposition system such that a film layer of the target material is simultaneously deposited on all exposed surfaces of said placed substrates including said plate-like surfaces of said ferrite core; and
   removing the substrates from the system after the desired film thickness is obtained from said operated system.

2. A process as defined in claim 1 wherein the air bearing one of said edge surfaces of the ferrite core is placed parallel to and facing the target of the system and further including the step of lapping the deposited material from the air bearing one of said edge surfaces of the removed substrates to expose the transducing gap.

3. A process as defined in claim 1 wherein the step of placing at least one bonded ferrite core into a vacuum deposition system places the bonded ferrite core oriented such that the plate-like surfaces of the ferrite core are radially extending with respect to the particle deposition center of the vacuum deposition system.

4. A process as defined in claim 1 wherein the step of placing places a plurality of said bonded ferrite cores in a circle about the particle deposition center of the vacuum deposition system such that the plate-like surfaces of each said bonded ferrite core is perpendicular to a target of the film material and the plate-like surfaces of each said bonded ferrite core are essentially positioned on a radius of the circle, all of said placed bonded ferrite cores having ferrite material with substantially similar magnetic characteristics being circumferentially spaced apart whereby all of said plate-like surfaces simultaneously receive said film layer during said system operation.

5. A process as defined in claim 1 wherein the target is alumina and the step of operating the deposition system simultaneously deposits a film of alumina on both the exposed plate-like surfaces of said placed ferrite core.

6. A process as defined in claim 1 wherein the operation step of said vacuum deposition system is a sputtering operation.

7. A process as defined in claim 6 further including the step of sputtering includes simultaneously sputter etching the plate-like surfaces of said placed bonded ferrite core before the step of simultaneously depositing the film layer on both of said plate-like surfaces.

8. A process for making a magnetic head comprising the steps of:
   obtaining a plurality of very thin substrates of a magnetic ferrite material, each of said substrates having a bonding edge surface joining two spaced-apart outwardly-facing plate-like surfaces and an air bearing edge surface joined to said bonding edge surfaces;
   edge bonding the obtained substrates at their respective bonding edges to form a bonded ferrite core having a transducing gap at said bonding edges;
   placing at least one bonded ferrite core into a vacuum deposition system such that the plate-like surfaces of the ferrite core are disposed perpendicularly to and spaced from a target of a film material to be deposited and are exposed such that they may be coated;
   operating the deposition system such that a film layer of the target material is simultaneously deposited on all exposed plate-like surfaces of said placed substrate;
   removing the substrate from the system after the required film thickness on said plate-like surfaces is obtained from said operated system; and
   disposing an electrical winding at said ferrite core to magnetically couple to said ferrite material.

9. A process as defined in claim 8 wherein the placing step disposes the air bearing surfaces of the bonded ferrite core parallel to and spaced from the target of the system and further including lapping the deposited material from the air bearing surfaces of the removed substrate to expose the transducing gap.

10. A process as defined in claim 8 wherein the step of placing at least one bonded ferrite core into a vacuum deposition system disposes the bonded ferrite core such that both of the plate-like surfaces of the bonded ferrite core extend substantially radially with respect to the particle deposition center of the vacuum deposition system.

11. A process as defined in claim 8 wherein the step of placing disposes a plurality of ferrite cores circumferentially spaced apart along a circle such that the plate-like surfaces of each ferrite core are perpendicular to and spaced from a target of the film material and are essentially positioned to extend along respective radii of the circle; and said circle being coaxial to the particle deposition center of the system being the center of the circle.

12. A process as defined in claim 8 wherein the target includes alumina and the step of operating the vacuum deposition system includes simultaneously depositing a film of alumina on the plate-like surfaces of said placed bonded ferrite core.

13. A process as defined in claim 8 wherein the operation step is a sputtering step.

14. A process as defined in claim 13 further including the step of sputtering so as to sputter etch said placed bonded ferrite core before depositing the film layer.

15. The process as defined in claim 8 wherein both the substrates have an edge width in the range of four thousandths of an inch or less.

16. The process as defined in claim 8 wherein the vacuum deposition system is a sputtering system which simultaneously deposits 50 to 20 micro-inches of alumina onto the plate-like surfaces of each said substrate.

* * * * *